United States Patent
Westberg

(10) Patent No.: US 7,092,269 B1
(45) Date of Patent: Aug. 15, 2006

(54) PHASE TO AMPLITUDE H-BRIDGE SWITCHING CIRCUIT

(75) Inventor: Jerry Michael Westberg, Quincy, IL (US)

(73) Assignee: Broadcast Electronics, Inc., Quincy, IL (US)

( * ) Notice: Subject to any disclaimer, the term of this patent is extended or adjusted under 35 U.S.C. 154(b) by 241 days.

(21) Appl. No.: 10/873,355

(22) Filed: Jun. 22, 2004

(51) Int. Cl.
*H02M 7/5387* (2006.01)
*H02M 3/24* (2006.01)
*H03F 3/38* (2006.01)
*H03F 3/217* (2006.01)

(52) U.S. Cl. ........................ 363/132; 363/98
(58) Field of Classification Search ............ 363/16, 363/17, 97, 98, 131, 132; 330/10, 207 A, 330/251, 277
See application file for complete search history.

(56) References Cited

U.S. PATENT DOCUMENTS

| | | | |
|---|---|---|---|
| 4,580,111 A | | 4/1986 | Swanson |
| 5,003,271 A | * | 3/1991 | Swanson ............... 330/298 |
| 6,072,362 A | * | 6/2000 | Lincoln ............... 330/10 |
| 6,294,957 B1 | * | 9/2001 | Luu ............... 330/251 |
| 6,300,829 B1 | * | 10/2001 | Luu ............... 330/251 |

OTHER PUBLICATIONS

Small-Signal Analysis of the Phase-Shifted PWM Converter, IEEE Transactions on Power Electronics, vol. 7, No. 1, Jan. 1992; pp. 128-135.

* cited by examiner

*Primary Examiner*—Matthew V. Nguyen
(74) *Attorney, Agent, or Firm*—Schiff Hardin LLP

(57) ABSTRACT

A high power AM-band transmitter amplifier comprises four switches in an H-Bridge configuration and operates by adjusting the duty cycle of the voltage waveform on a transformer. The duty cycle is adjusted by changing the phase relationship between the diagonal switch pairs. An embodiment of the amplifier operates efficiently by the addition of a current source that may comprise inductor and capacitor circuits to assure zero voltage switching of all the switches. The inventive H-Bridge configuration can also be utilized in a phase modulated power supply.

18 Claims, 15 Drawing Sheets

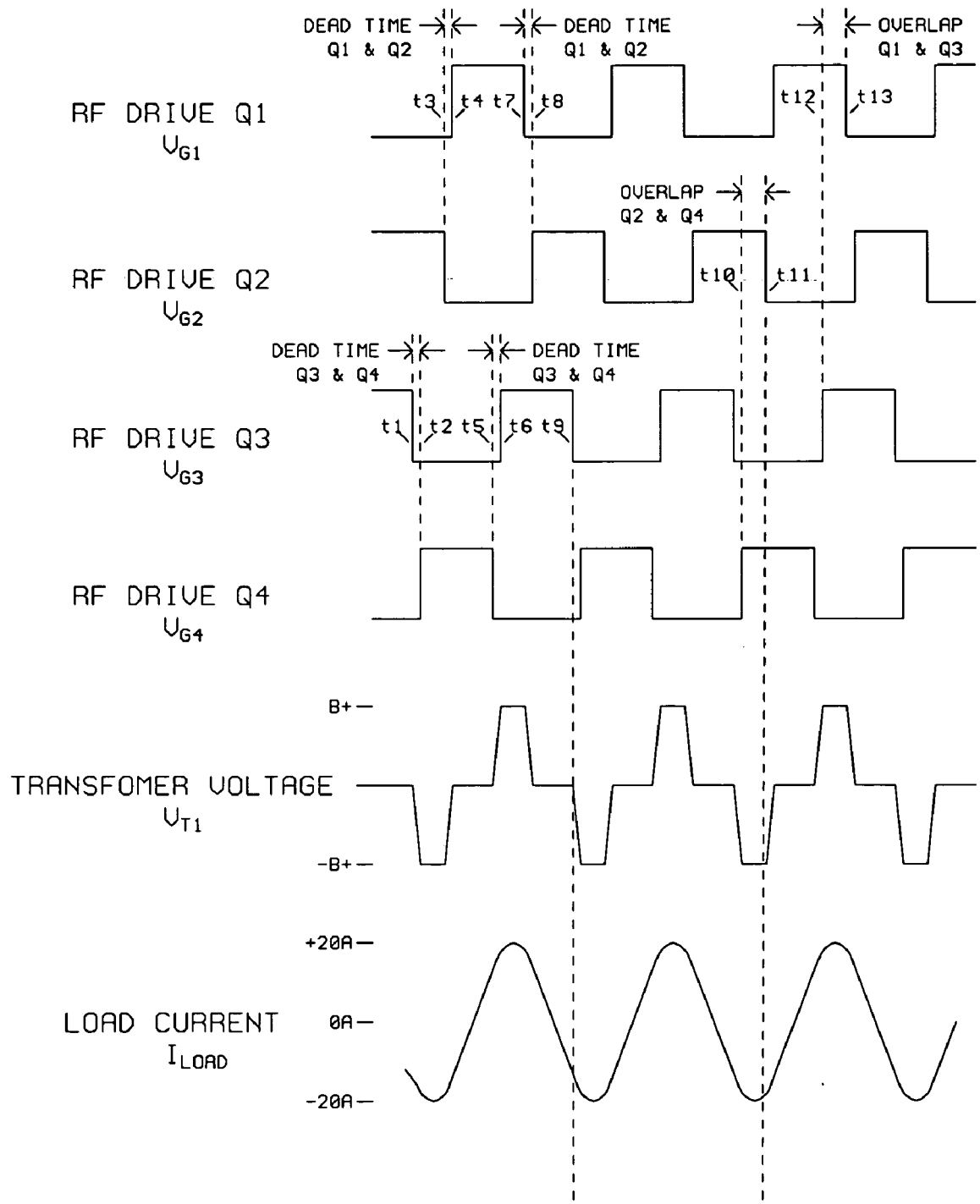

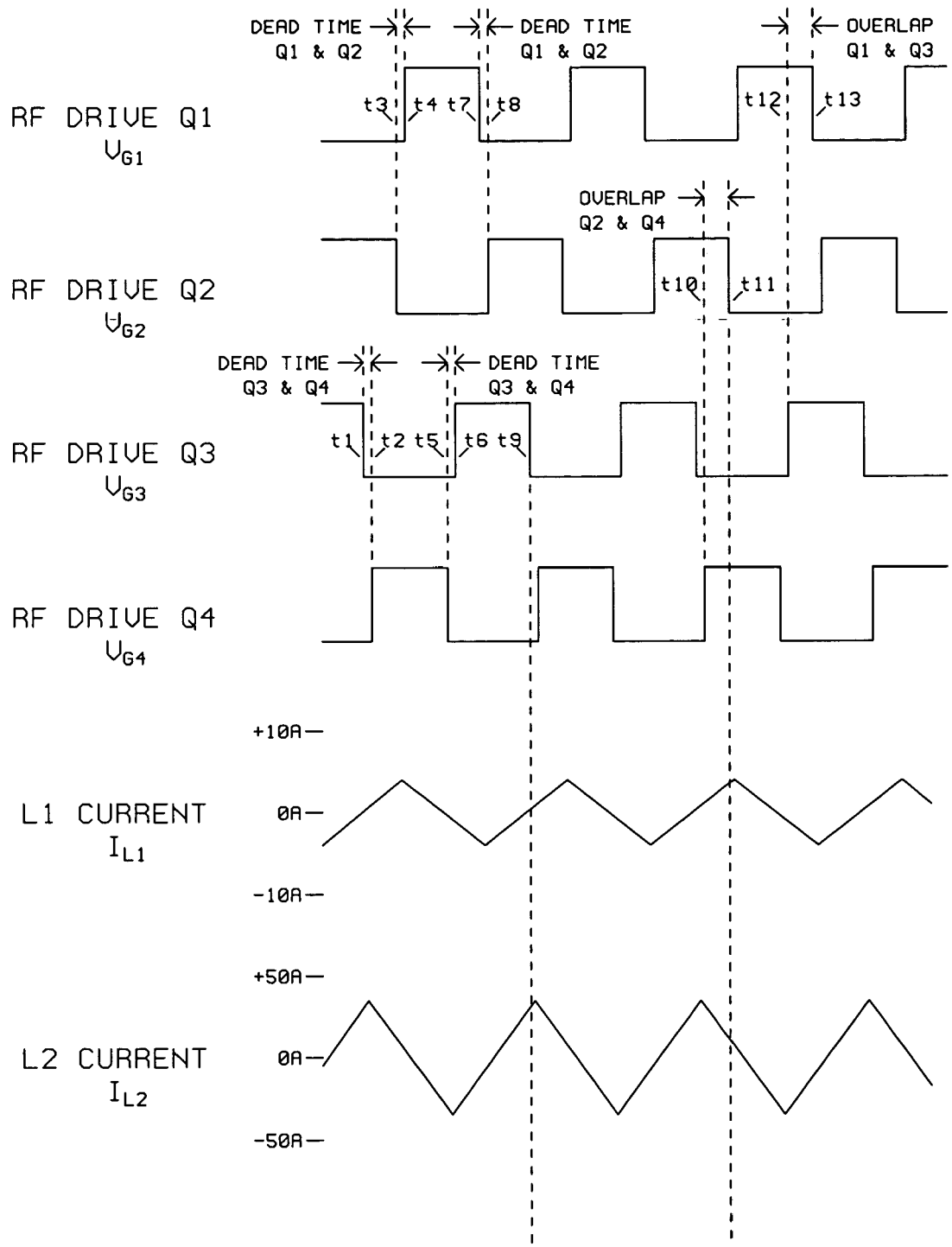

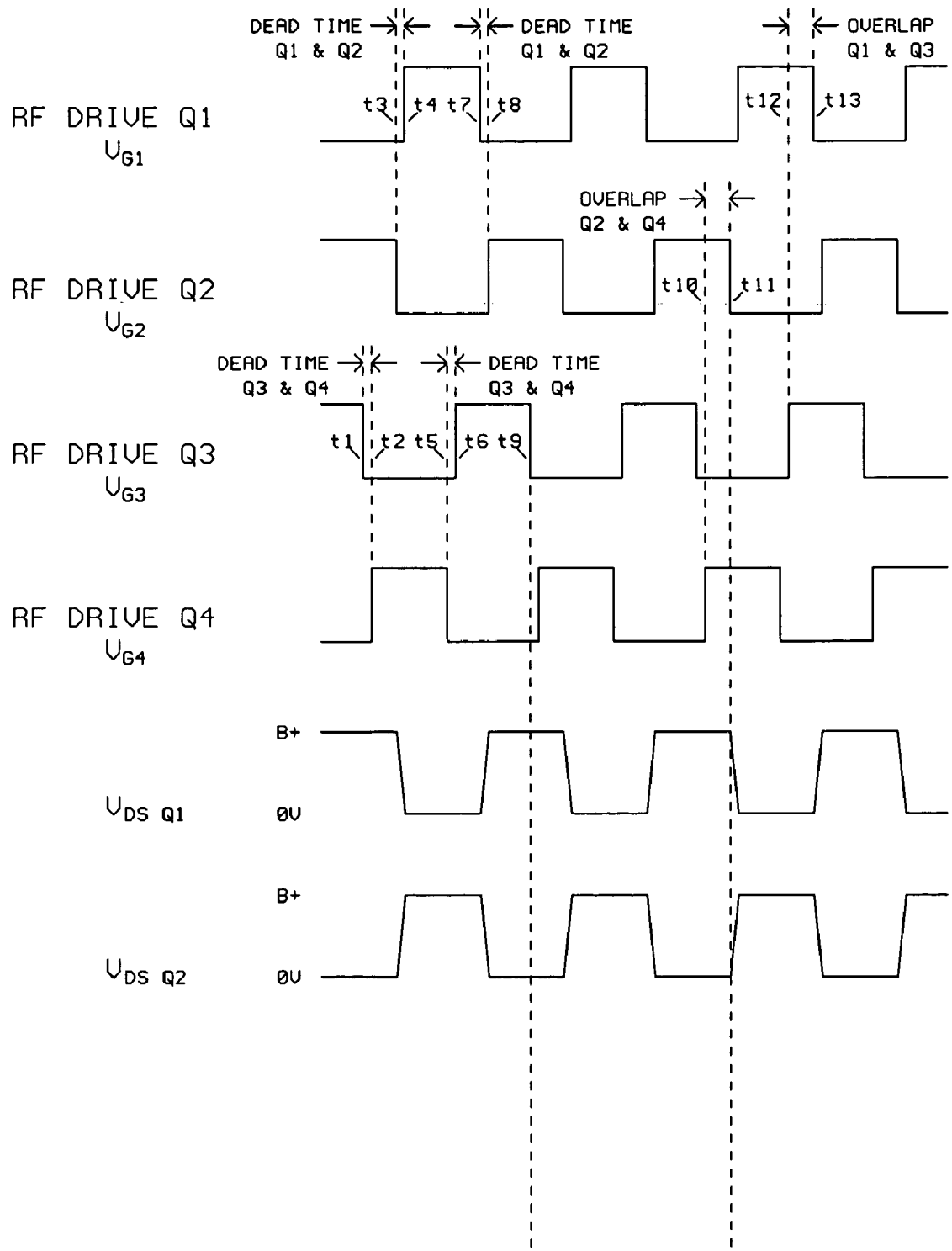

PHASE TO AMPLITUDE H-BRIDGE SWITCHING CIRCUIT

BACKGROUND OF THE INVENTION

The present invention relates generally to an H-Bridge switching circuit that can be used in a power amplifier for a radio transmitter or a switching power supply.

It has been well known in the switching power supply industry that high efficiency systems can be designed by chopping a voltage to produce another voltage. Pulse width regulated power supplies operate at efficiencies in excess of 97%. However, the higher switching frequencies needed to operate in the AM band tend to increase switching losses. Also, it becomes difficult to turn FETs, which are commonly used in switching power supplies, on and off quickly enough when the duty cycle is small.

It has always been a goal to produce AM transmitters that will be more efficient. AM transmitters using two stages to do the modulation and the amplification of the audio signal are known and are suitable for handling transmitters up to a power of 10 kW. However, it is difficult to reach necessary efficiencies (e.g., 86%) using a separate modulator and amplifier for higher power level (e.g., 25 kW, 50 kW and 100 kW) transmitters. An amplification-modulation scheme that is much more efficient is required for the higher power levels.

One way to improve efficiency is to remove sections of the transmitter or to group different parts of the transmitter. In general, an AM transmitter comprises a power supply, modulator, power amplifier, combiner, and output network. Each of these parts has an associated energy loss that adds up to form the total system loss.

It is known to combine the modulation and the amplification into one stage to improve efficiency. To perform the modulation of the transmitters, known systems turn the amplifiers off and on. These amplifiers are added through RF combiner transformers on the output of each RF stage. This means that many amplifiers are needed to reduce the change in amplitude when one module is turned off or on. These systems prove impractical below the 10 kW power level because of the large number of amplifiers needed to apply this scheme.

A design known from U.S. Pat. No. 4,580,111 can operate fairly efficiently, however, one difficulty with this type of design is that it is only practical for high power (e.g., 10 kW and above—at, e.g., 9 kW watts and below, particularly at 5 kW and below, this circuit becomes increasingly impractical). To build this type of design, enough modules are needed so the step size in turning a module off and on will be small.

SUMMARY OF THE INVENTION

The present invention provides a scheme for reducing the duty cycle to zero when necessary and, in an embodiment of the invention, addresses the increasing switching losses that occur at high frequencies. The present invention works equally well at high power as well as low power (below 10 kW).

An amplifier using the inventive H-Bridge circuit performs the amplification by reducing the duty cycle of the signal from each amplifier going to the RF combining transformers. Instead of turning the amplifiers off and on, as is known in the art, the proposed design increases and decreases the power of all amplifiers. This allows each amplifier to operate on its own. Amplification can be made with one amplifier as well as with many amplifiers combined. Thus, the inventive amplifier remains practical to implement below 10 kW. A practical single amplifier can operate as low as 500 watts or even less.

Two inventive features address the goal of reducing the duty cycle and the switching losses associated with high frequency switching. An embodiment of the invention utilizing the first feature involves adjusting the duty cycle at an RF frequency by changing the phase relationship between diagonal switch pairs (e.g., FETs Q1 and Q3) rather than reducing the duty cycle on any one switch. This allows the duty cycle on any one switch to remain at 50% while changing the duty cycle on the combiner transformer to as large or small as necessary. When the switching frequencies get higher, it becomes difficult to turn the switching devices on and off quickly enough when the duty cycle is small. A small duty cycle drive signal either turns the switch on for a longer than desired period of time or does not turn the switch on at all. The present invention provides a solution to this problem by keeping the duty cycle on each switch at 50%. To reduce the amplitude of the output RF waveform, the duty cycle on the transformer is reduced, and not the duty cycle on the switch.

An embodiment of the invention involves the second feature of making the amplifier itself efficient. As mentioned earlier, high efficiency systems can be achieved by chopping a voltage to produce another voltage. This is used extensively in the power supply industry. However, maximizing the efficiency in the application of high-power RF transmitters calls for switching frequencies that are on the order of 10 times higher. When the frequency is raised, the switching losses go up and the efficiency goes down. To improve the efficiency of this system, it is necessary to turn each switch (e.g., FET) on when the voltage across it is zero. Zero voltage switching is achieved by providing current into the amplifier using circuits consisting of inductors and capacitors.

According to an embodiment of the invention, a power amplifier (PA) operates generally, but not exclusively, in the AM frequency range (540 kHz–1710 kHz). The PA performs both the amplification function and the modulation in the same design. The PA comprises switches that are four field effect transistors (FETs) connected in an H-Bridge configuration with a transformer at the horizontal part of the "H". The FETs are operated out of the normal phasing to provide a duty cycle modulated waveform across the transformer. This signal is then filtered to provide the standard AM modulation. To produce a high efficiency PA, two coils are provided to assure zero voltage from drain to source of each FET when they are turned on, regardless of the modulation level.

According to another embodiment of the invention, a switching power supply, the filter and load normally in the amplifier may be replaced with a rectifier circuit, filter, and load.

BRIEF DESCRIPTION OF THE DRAWINGS

The invention is explained in more detail below, with reference to the drawing figures illustrating exemplary embodiments of the invention.

FIGS. 7A–D are timing charts illustrating the relationships between various circuit signals in relation to the phases the drives of switches Q1–Q4;

DETAILED DESCRIPTION OF THE PREFERRED EMBODIMENTS

Figures 1A, 1B:
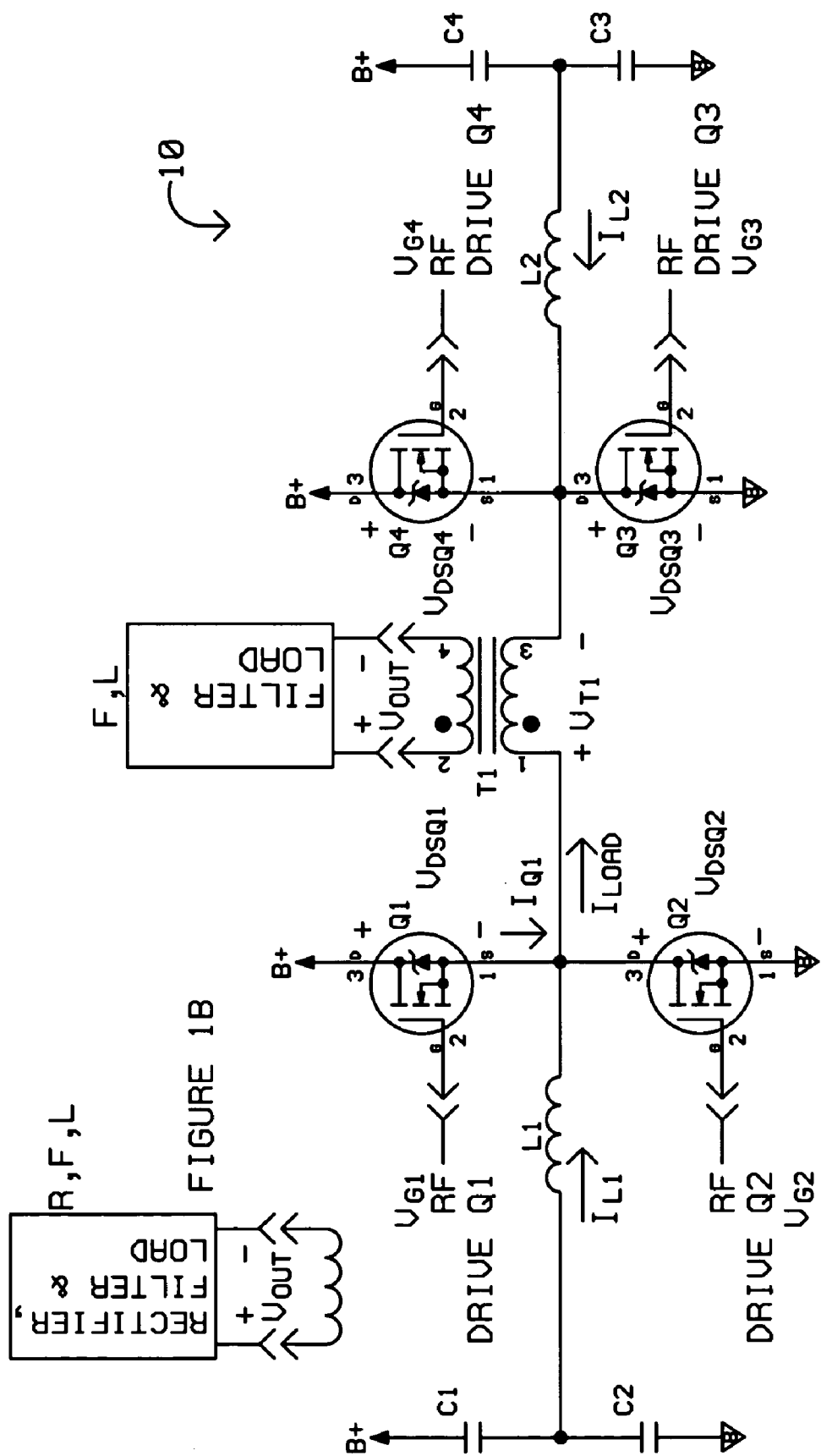
FIG. 1A is a circuit schematic of an embodiment of the inventive power amplifier H-Bridge circuit.
FIG. 1B is a circuit block schematic showing the replacement of a filter and load with a rectifier circuit, filter, and load for operation as a switching power supply.

Various embodiments of the invention are described in the following text. FIGS. 1A, 1B illustrate a schematic diagram of an embodiment of the inventive power amplifier H-Bridge circuit 10. FIG. 1A shows the circuit used to feed a filter and load F, L for power amplification, and FIG. 1B shows the replacement of the filter and load F, L with a rectifier, filter, and load R, F, L for use as a power supply.

Figure 8:
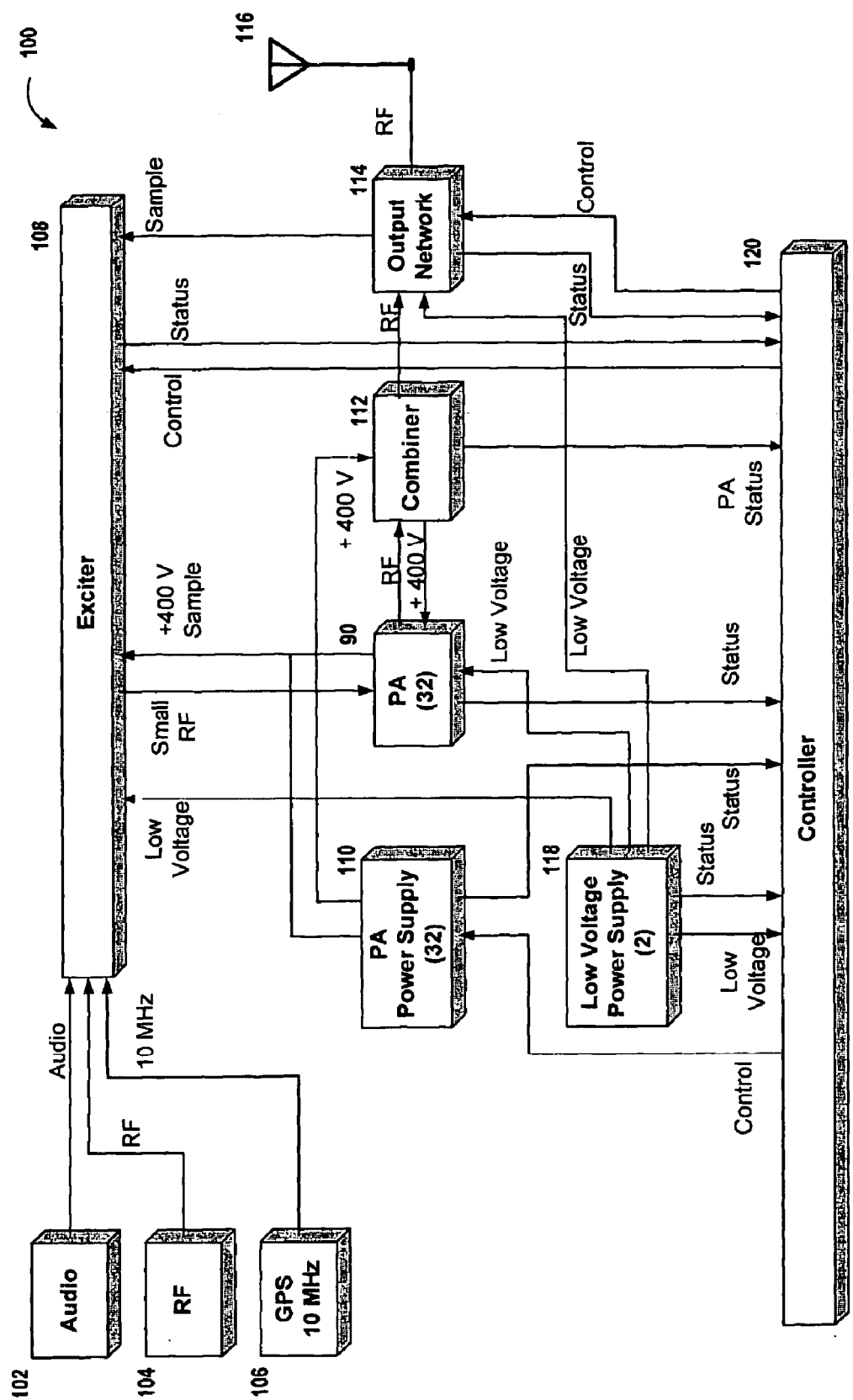
FIG. 8 is a block diagram of an RF system in which the inventive circuit operates.
Figure 9:
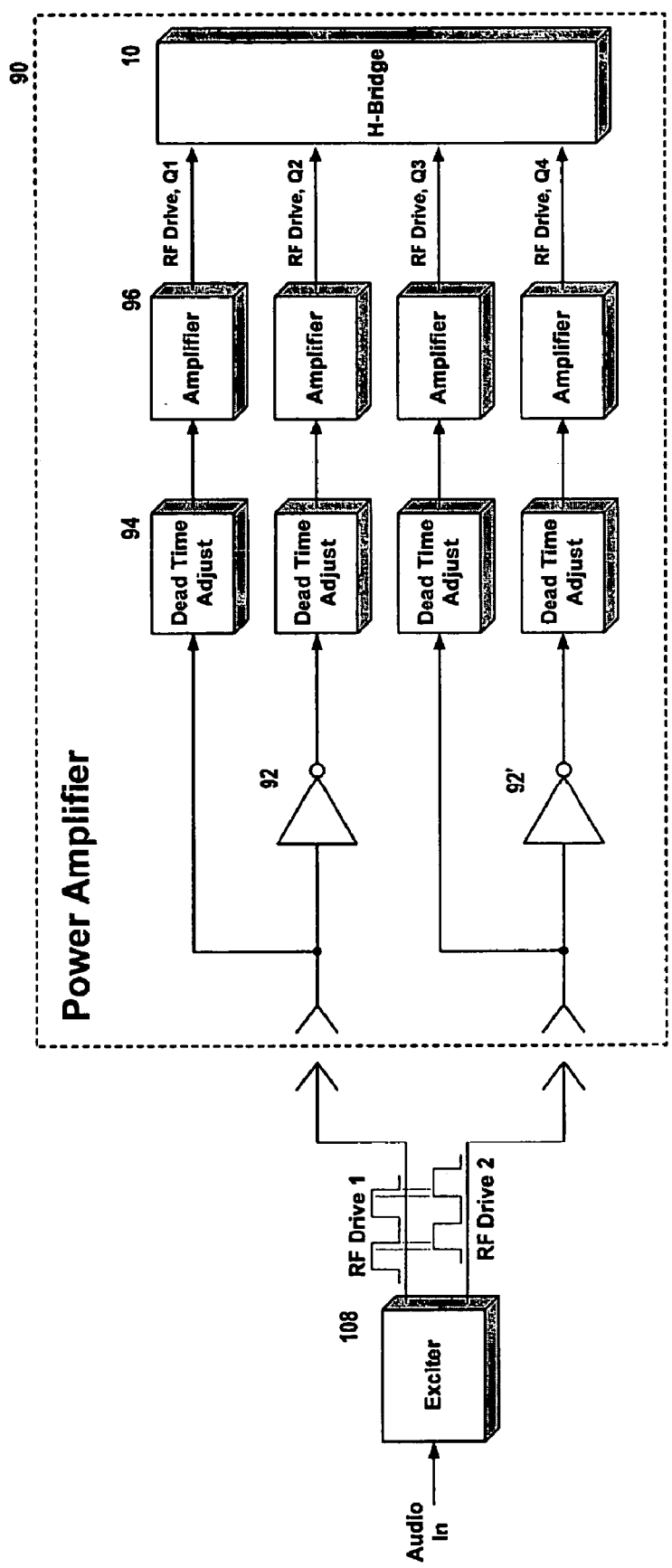
FIG. 9 is a block diagram of the exciter circuit used to drive the H-Bridge circuit.

FIGS. 8 and 9 illustrate an exemplary context in which the H-Bridge circuit 10 may be used for an AM-band PA, and thus provide an overview of an applied variation of an inventive embodiment.

As illustrated in FIG. 8, an RF system 100 comprises an audio source 102, an RF signal generator 104, and a Global Positioning System (GPS) 106. A power amplifier power supply 110 and low voltage power supply 118 are used to supply power to the various components of the RF system 100 (numbers in parentheses in FIG. 8 indicate the number of individual components that may be used in an exemplary system). An exciter 108 that accepts signals from the generators 102, 104, 106, provides drive signals to the power amplifier 90, and the power amplifier 90 sends its signals to a combiner 112 whose output is connected to an output network 114 used to interface to an antenna 116 that is used to transmit the RF signals. A controller 120 is present to provide control signals to the power supply 110 and the output network 114 and also to receive status from the various system components.

As shown in FIG. 9, the H-Bridge circuit 10 is driven by the exciter 108 having two inputs to the power amplifier 90. The power amplifier 90 splits the two inputs into four with the use of two inverters 92, 92'. An audio signal is sent by the audio source (e.g., audio processor or signal generator) 102 to the exciter 108 that produces a proper overlap for a particular audio level. The exciter 108 sends out two signals phased to yield the desired RF amplitude in the filtered output which is proportional to the audio input signal. The two signals from the exciter 108 are sent to the power amplifier 90 where each signal is split. One part of the signal is sent directly to a circuit that adds dead time 94 while the other part of the signal is inverted first, via the inverters 92, 92' before being sent to the dead time circuitry 94. This produces the drive RF Drive Q1–Q4 for the four FETs Q1–Q4.

Figure 2:
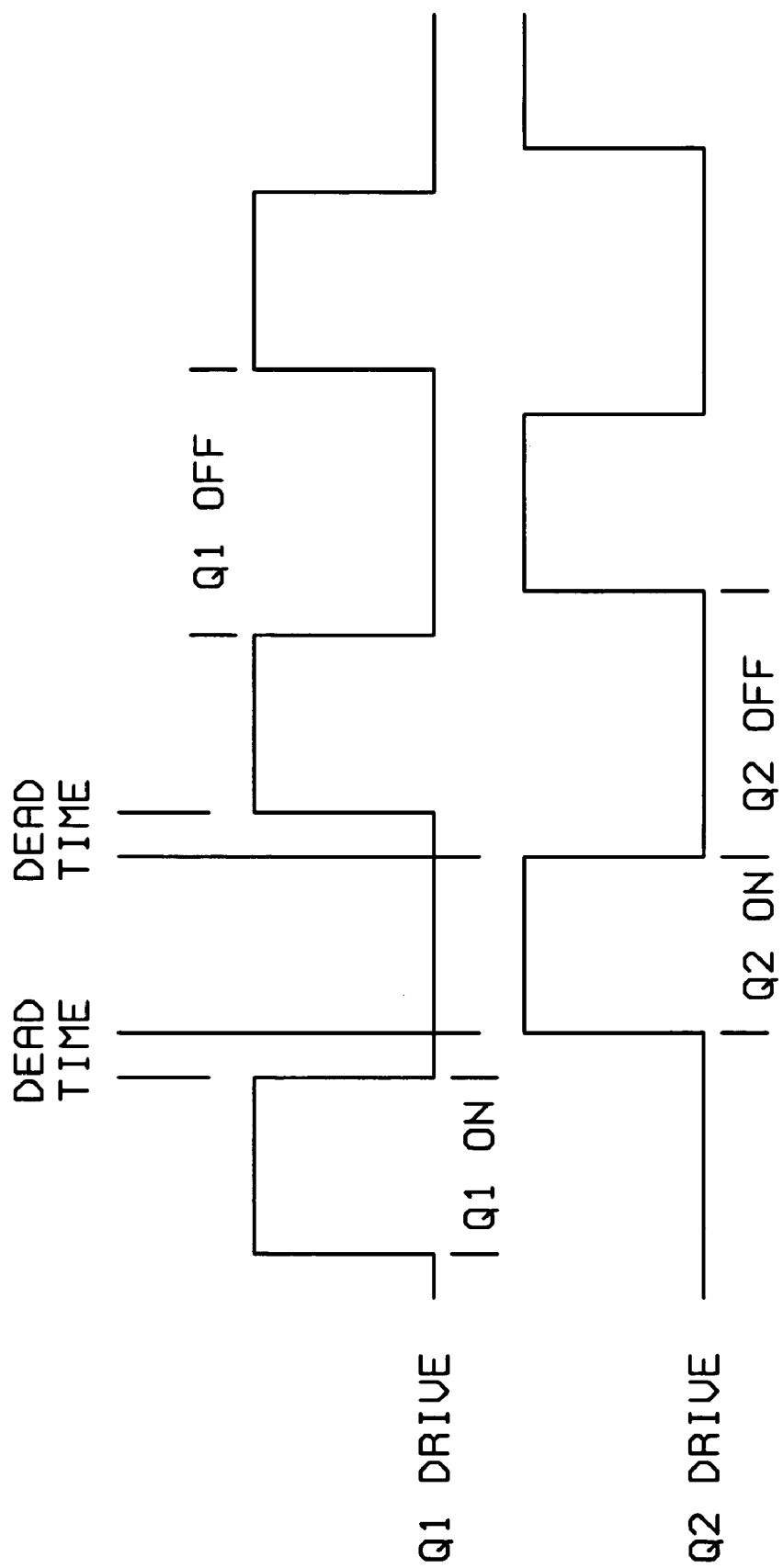
FIG. 2 is a timing chart illustrating the phase relationship between the drive of switches Q1 and Q2.

In the embodiment of the inventive H-Bridge circuit 10 shown in FIG. 1, FETs Q1 and Q2 are switched out of phase with, e.g., about 35 nS of dead time (i.e., the time that both Q1 and Q2 are off) between them, as illustrated in the timing diagram of FIG. 2 (the drives being illustrated, as described above, by FIG. 9). The dead times specified are somewhat arbitrary, but 35 nS has worked well in experiments conducted by the inventor for the embodiments described herein. The longer the dead time, the lower the current needs to be in the inductors L1 and L2 described below because they have a longer time to change the voltage state of junction points of the switches.

Figure 7D:
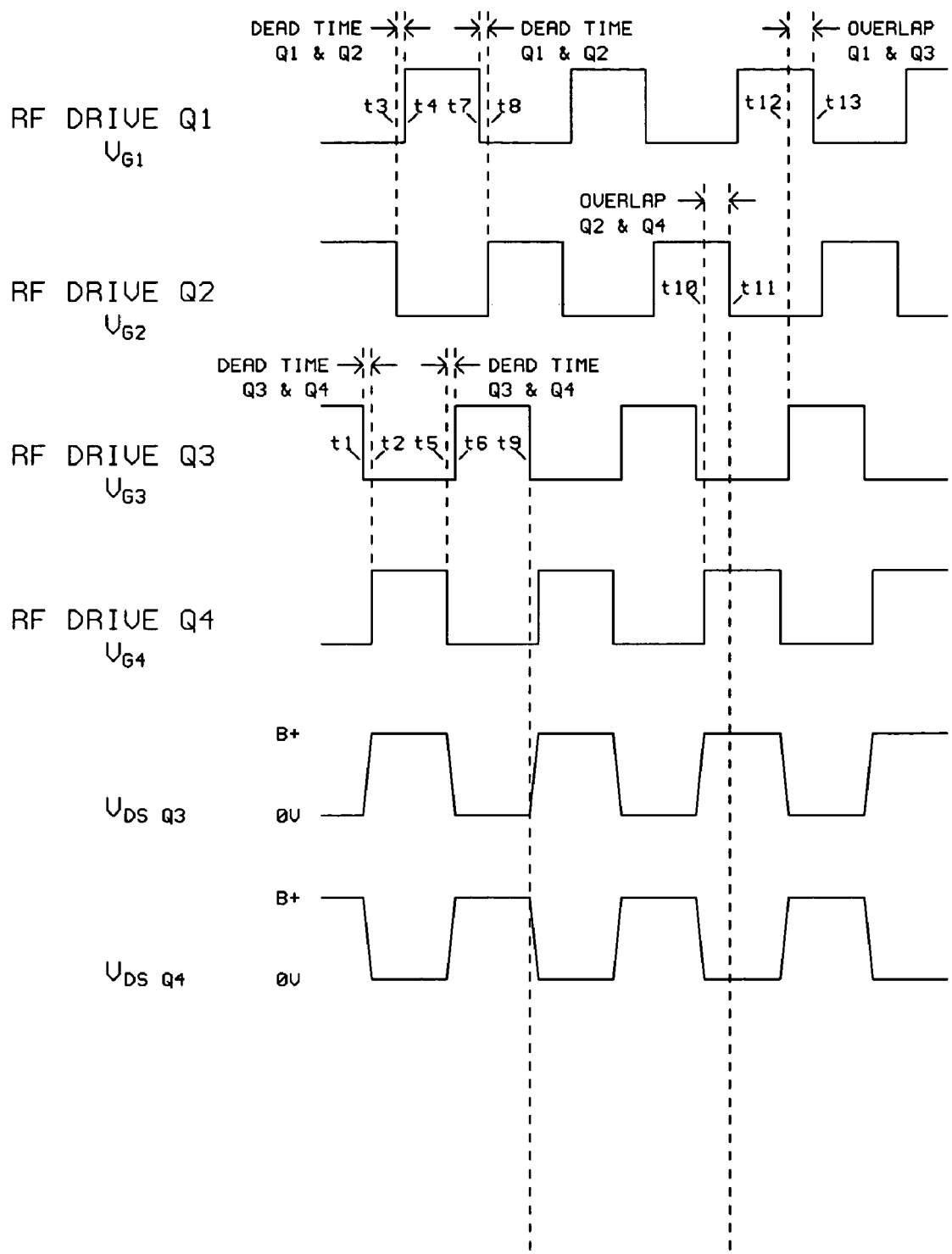

Thus, as illustrated in FIG. 7A, which illustrates a more detailed timing relationship of the signals, FET Q2 is switched off at time t3, and then 35 nS later (for example), at a later time t4, FET Q1 is switched on. FET Q1 remains on until time t7 when it is switched off, and 35 nS later (for example), FET Q2 is switched on at a later time t8. FETs Q3 and Q4 operate exactly like FETs Q1 and Q2, where FETs Q3 and Q4 are also out of phase with a set dead time.

The switches (FETs Q1–Q4) that are used in this embodiment may be, e.g., those from Advanced Power Technology, PN APT5010JFLL; these FETs have a fairly fast recovery diode. This particular part is specified for an application calling for a B+ voltage of 400 volts since it can operate to 500 volts, however, design could be used at other voltages with other devices.

Figure 3:
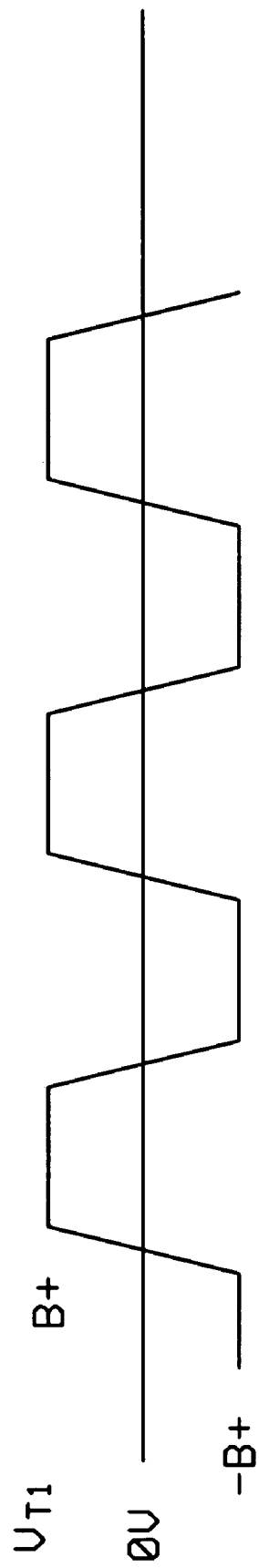
FIG. 3 is a timing chart illustrating the voltage on transformer T1 for a known H-bridge design.

With the positive voltage as marked on FIG. 1A, when both FETs Q1 and Q3 are turned on by a respective first and third drive signals $V_{G1}$, $V_{G3}$, (FIG. 7A, between t6 and t7) a B+ voltage $V_{T1}$ is place across the transformer T1. The duty cycle where both FETs Q1 and Q3 are turned on depends on the phase relationship between the drive signals $V_{G1}$, and $V_{G3}$. When both Q2 and Q4 are turned on by a respective second and fourth drive signals $V_{G2}$, $V_{G4}$, the opposite (–B+) voltage $V_{T1}$ is placed across the transformer. This is different than a known H-Bridge design, where FETs Q1 and Q3 would be turned on at the same time (i.e., always in phase), and then subsequently turned off. The known H-Bridge design would always produce a 50% duty cycle square wave across the transformer, as illustrated in FIG. 3.

As shown in the drawings, reference character B stands for bulk supply and is produced by the power amplifier power supply 110. B+ represents the positive voltage and B– the negative (a relative ground). In a typical application, B+ may be, e.g., 400 volts above B–. B– is shown in FIG. 1 with a ground symbol having a "B" in it. The source of FETs Q2 and Q3 are connected to B– as well as the grounded side of C2 and C3.

Figure 4:
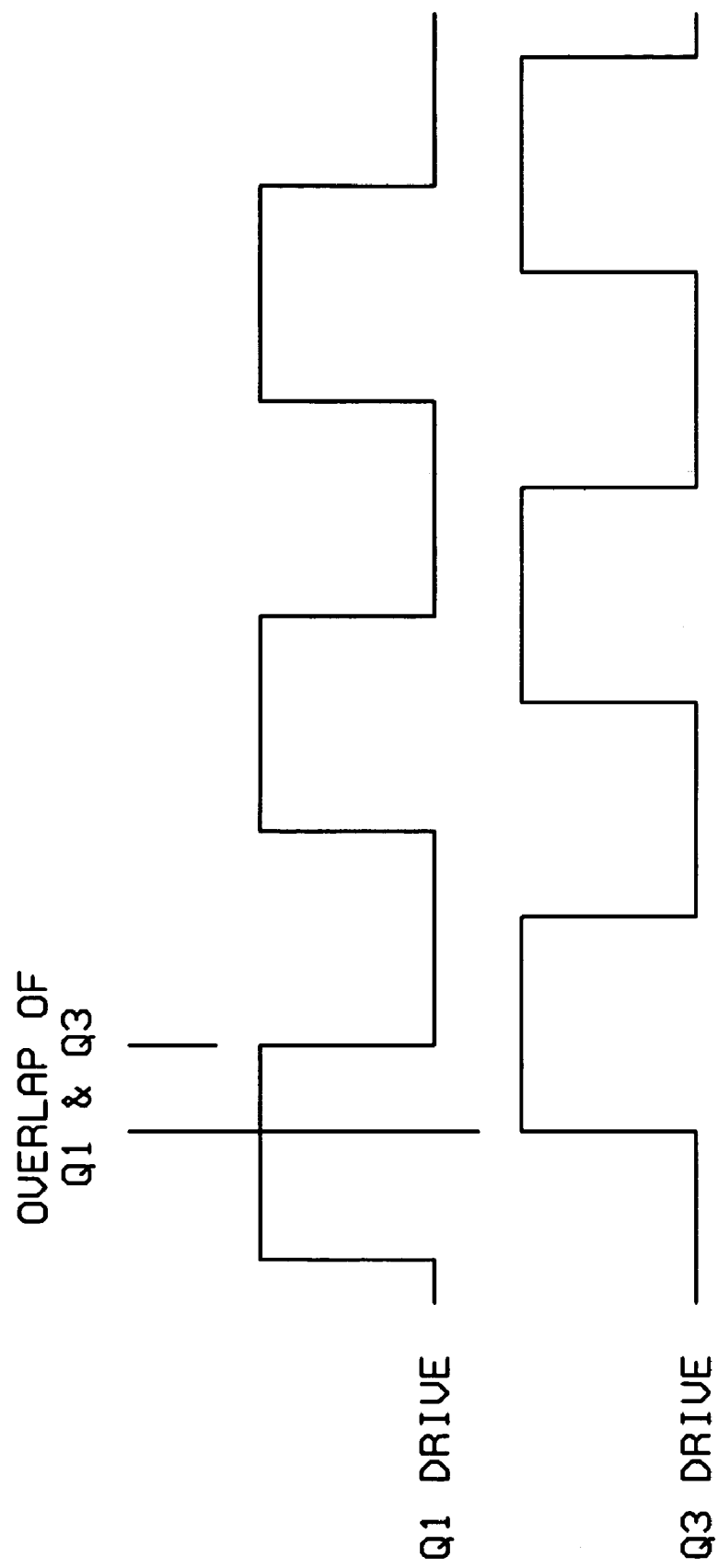
FIG. 4 is a timing chart illustrating a specific drive phase relationship between switches Q1 and Q3.
Figure 5:
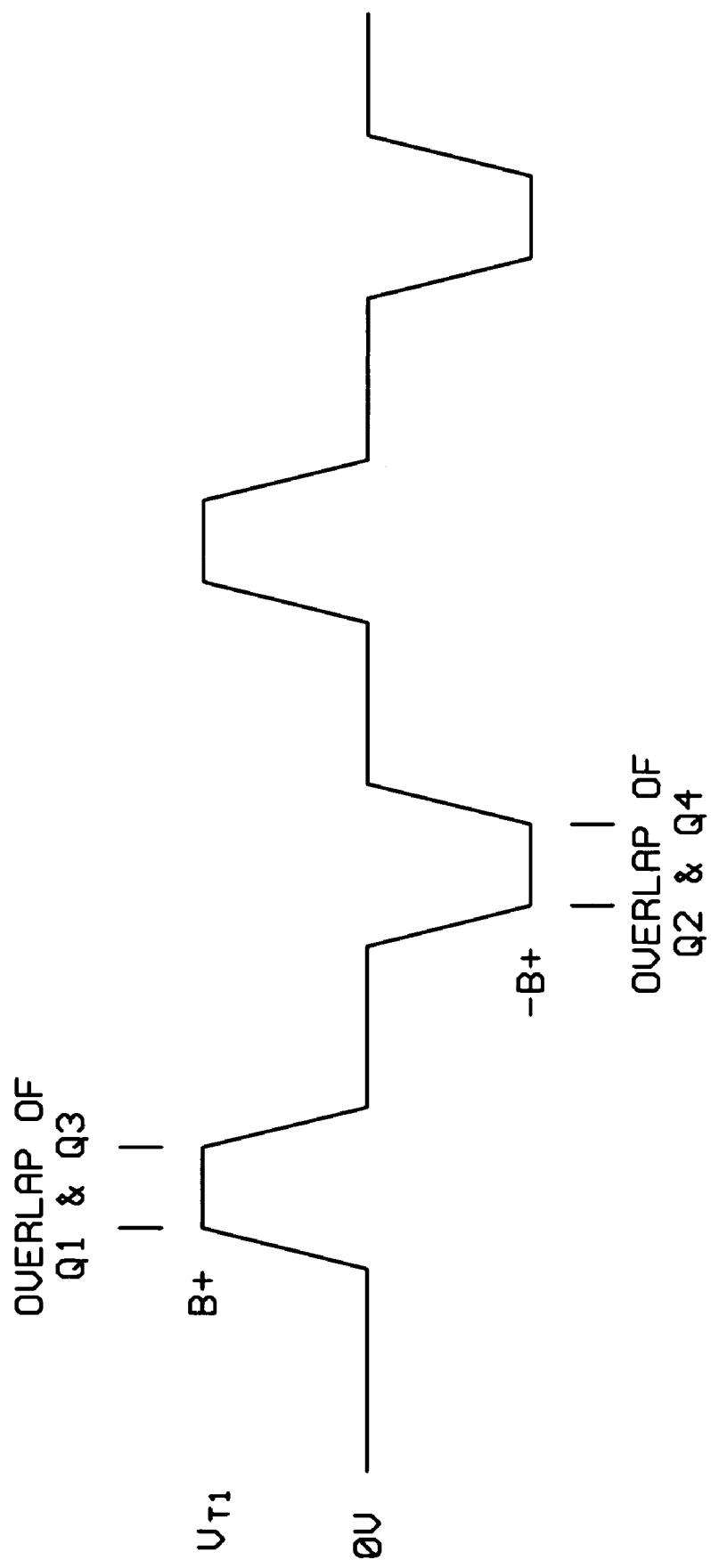
FIG. 5 is a timing chart illustrating the specific voltage across transformer T1 using this design.

According to the H-Bridge 10 design, FETs Q1 and Q3 are not turned on at the same time but are shifted in phase. FET Q1 is turned on first (t4) then FET Q3 is turned on some time later (t6). Similarly, FET Q2 is turned on first (t8) and then FET Q4 is turned on some time later (one cycle after t2, as shown in the figure). FIG. 4 shows a specific phase relationship of the drive on FETs Q1 and Q3. FETs Q2 and Q4 have a corresponding phase relationship. The voltage B+ will only appear across transformer T1 ($V_{T1}$) when both FETs Q1 and Q3 are turned on. The voltage –B+ would only appear across T1 ($V_{T1}$) when FETs Q2 and Q4 are both on. FIG. 5 shows the voltage $V_{T1}$ across transformer T1 with a specific phase relationship between FETs Q1 and Q3. FIG.

5 also shows where there is overlap between the drive signals of FETs Q1 and Q3 as well as the overlap between the drive signals of FETs Q2 and Q4. FIG. 7A illustrates the phase relationships between the drives of FETs Q1–Q4.

Figure 6:
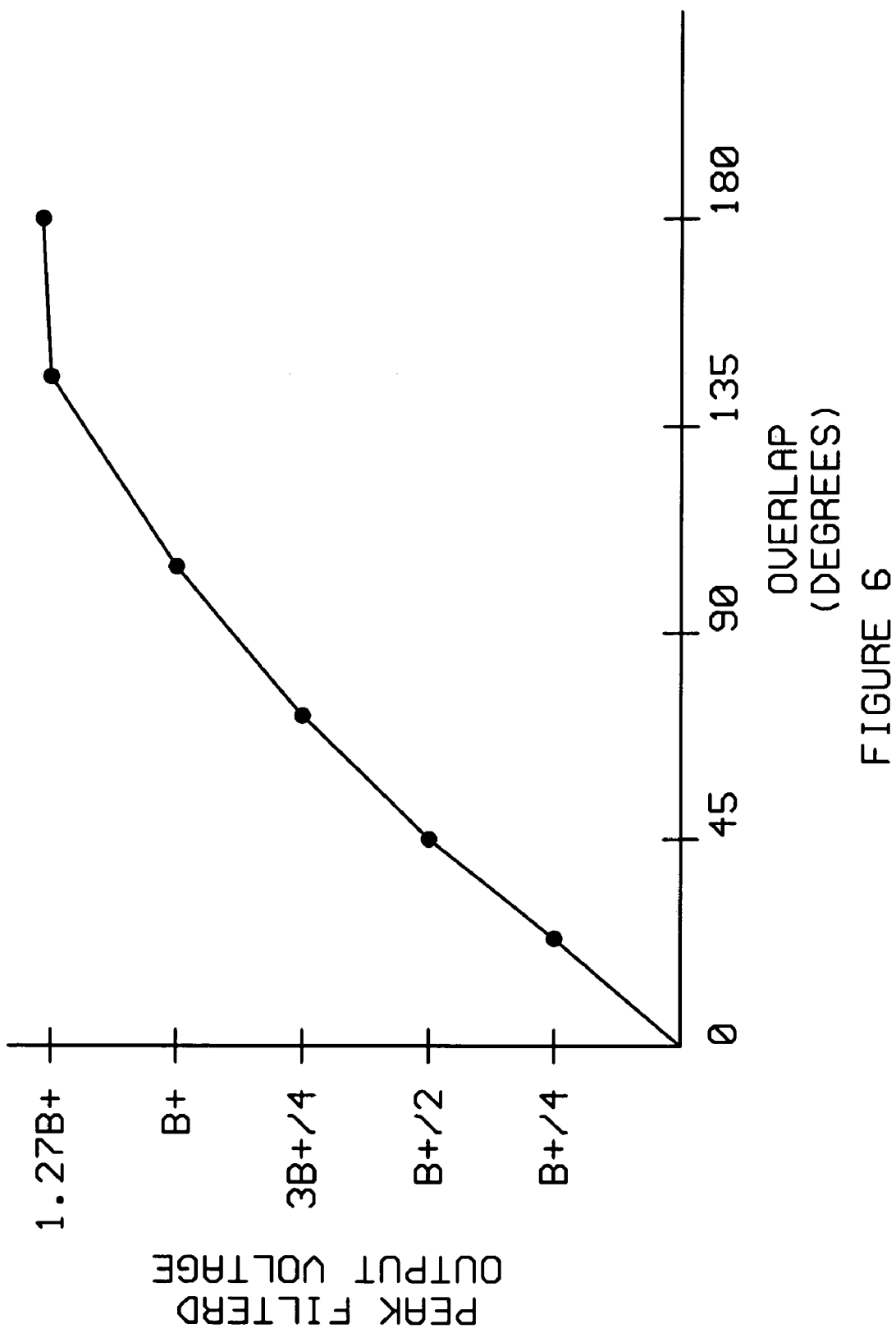
FIG. 6 is a graph illustrating the peak filtered output voltage vs. overlap phase.
Figure 10:
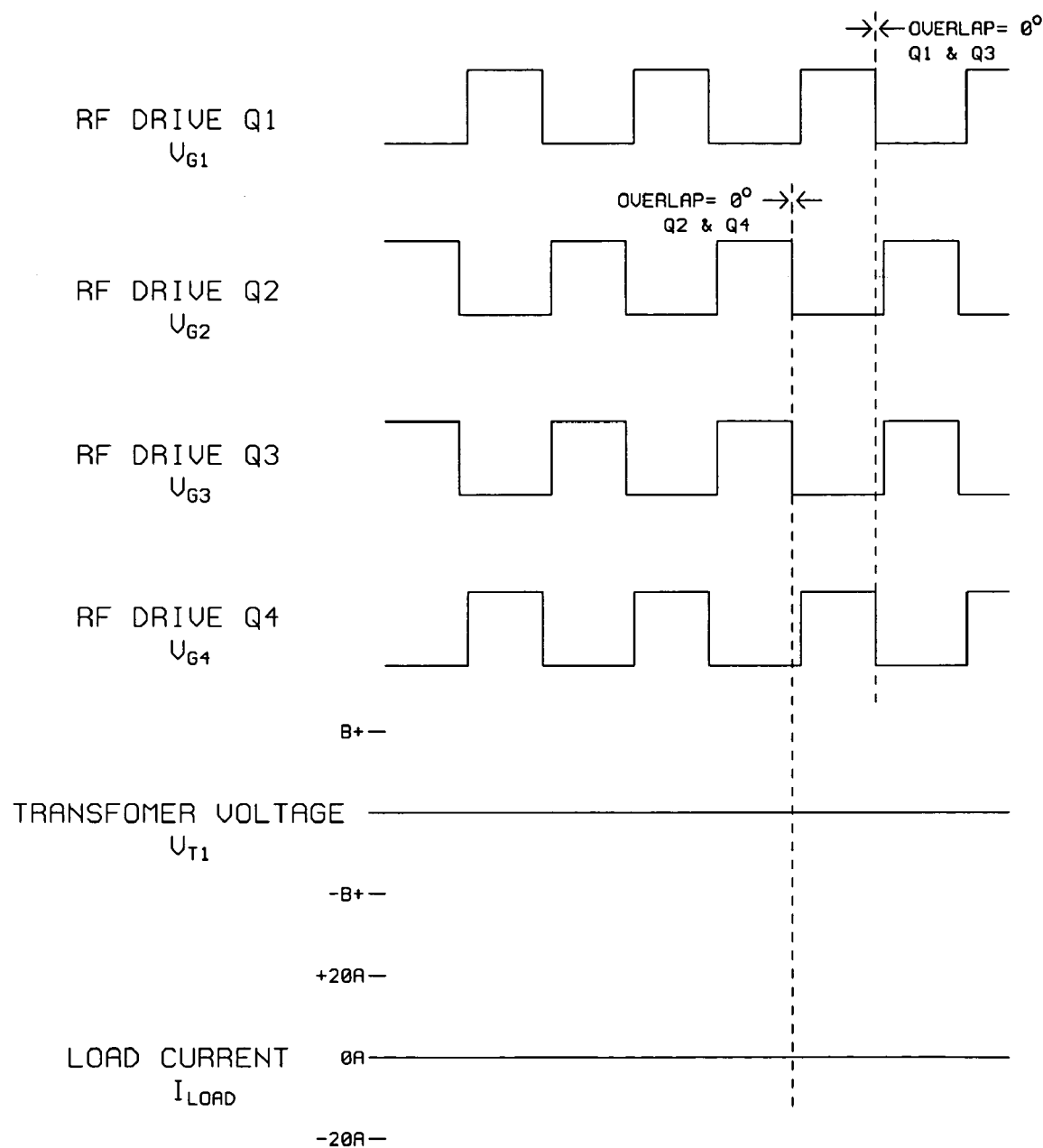
FIG. 10 is a timing chart illustrating the transformer voltage and load current when the drives of Q1 and Q3 do not overlap.

The overlap time when both FETs Q1 and Q3 are turned on (t6 to t7) determines the amplitude of the filtered output signal (this similarly applies for FETs Q2 and Q4). If FETs Q1 and Q3 happen to be out of phase, then the resulting voltage across the transformer $V_{T1}$ will be zero (e.g., as illustrated in FIG. 10). This produces a filtered output of zero. If FETs Q1 and Q3 have some time where they are simultaneously turned on, the filtered output will be greater than zero. By changing the time of the drive signal overlap with the adjustment circuitry 92, 92', 94, 96, 108, i.e., the phase difference between the drives of FETs Q1 and Q3, the filtered output can also be changed. Therefore, by adjusting the overlap of the on state of FETs Q1 and Q3, the output RF voltage can go from zero to, theoretically, 1.27 times the B+ voltage, as the amplitude of the filtered output sine wave can be determined by calculating the first coefficient of the Fourier series for the transformer voltage $V_{T1}$. For the maximum RF filtered output, the transformer voltage is a square wave with the first Fourier coefficient of $4(B+)/\pi = 1.27(B+)$. A graph of the overlap in degrees vs. filtered output voltage in percent of B+ voltage is shown in FIG. 6. The theoretical amplitude is represented by the equation $4(B+)/\pi \cdot \sin(\theta_{overlap}/2)$.

Another important aspect of the design is to have the power amplifier operate efficiently. To improve the efficiency of this system, it is necessary to turn each switch (e.g., FET) on when the voltage $V_{DSQ1,2,3,4}$ across it is zero. This minimizes the power losses associated with switching the FETs on. Zero voltage switching is achieved by providing current $I_{L1}$ into the junction point of FETs Q1 and Q2 (the source of FET Q1 and drain of FET Q2) during the dead time. The same would also be true for FETs Q3 and Q4 (a current $I_{L2}$ into the junction point). The current into the junction point of FETs Q1 and Q2 is the current $I_{L1}$ supplied by an inductor L1, minus the current used by the load $I_{LOAD}$. The current into the junction point of FETs Q3 and Q4 is the current $I_{L2}$ supplied by an inductor L2, plus the current used by the load $I_{LOAD}$.

As mentioned above, one source of current is the load L itself ($I_{LOAD}$). The load current $I_{LOAD}$ coming from the junction point of FETs Q1 and Q2 is more than sufficient to assure a zero voltage across FETs Q1 and Q2 when they are turned on, except for two cases. When the drives to FETs Q1 and Q3 are in phase (this would correspond to the maximum positive audio modulation) and when the drives to FETs Q1 and Q3 are out of phase (this would correspond to the maximum negative audio modulation), there is not enough load current $I_{LOAD}$ to assure zero voltage switching of FETs Q1 and Q2.

Figure 11:
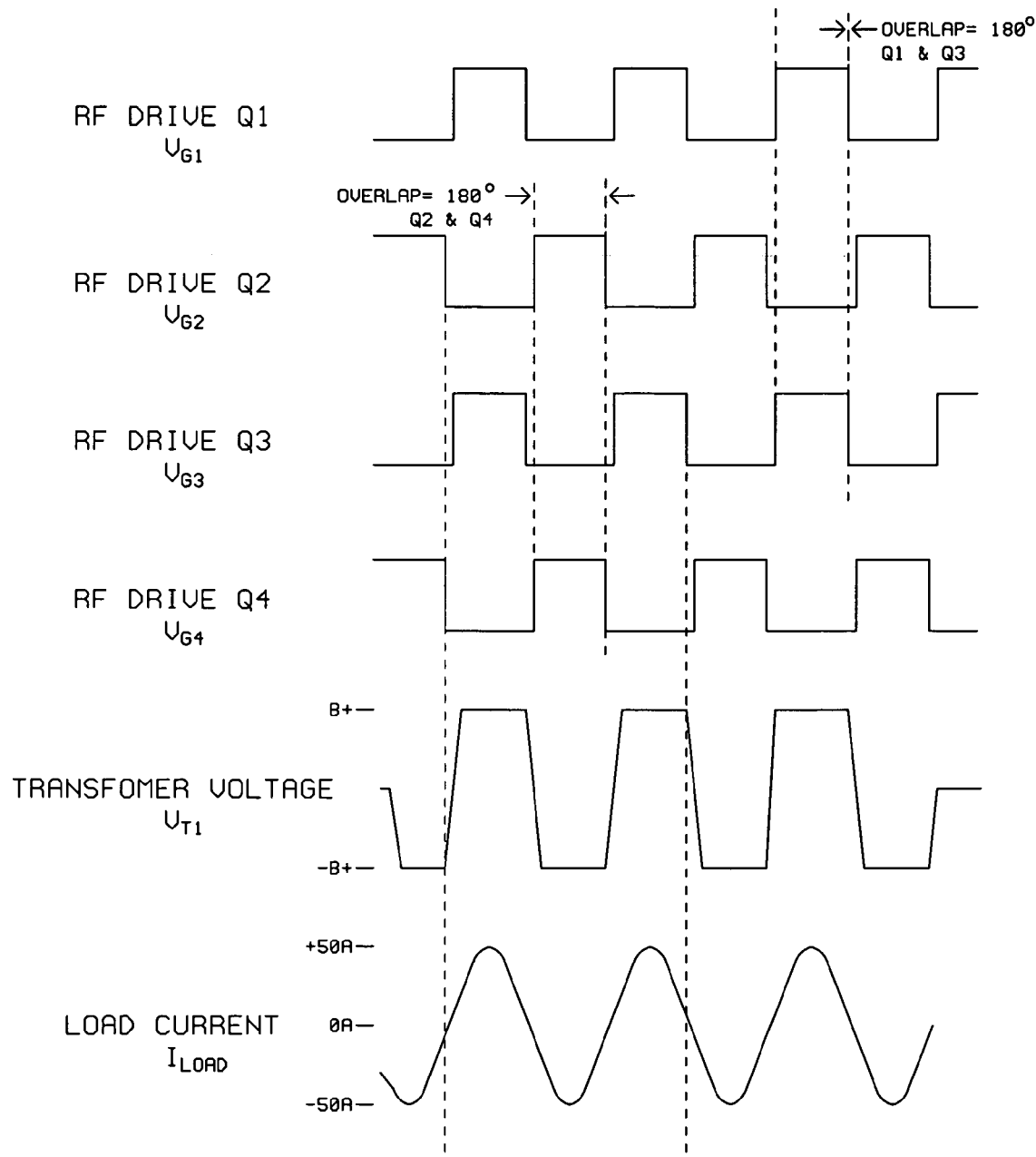
FIG. 11 is a timing chart illustrating the transformer voltage and load current when the drives of Q1 and Q3 overlap completely.

Under these conditions, the load current $I_{LOAD}$, when FETs Q1 or Q2 are turned off, is theoretically zero. This can be seen in FIGS. 10 and 11. This means that no current is available to change the voltage state at the junction point of FETs Q1 and Q2 to assure their zero voltage switching. There is a time when the drive going to Q1 and Q3 are either in phase (as shown in FIG. 11) or out of phase (as shown in FIG. 10). The phase reference will be determined by the audio 102 supplied to the exciter 108. The exciter 108 produces the drive wave forms for FETs Q1 and Q3. The phase relationship between FETs Q1 and Q3 are constantly changing as the audio signal 102 going to the exciter 108 is varied. When the audio voltage is at a minimum during a negative modulation peak of audio, the exciter 108 will send out two signals that will produce drive signals to FETs Q1 and Q3 that are out of phase as in FIG. 10. This will produce no voltage across the transformer and no filtered output voltage. When the audio voltage is at its maximum peak, the exciter 108 will send drive signals that are in phase as shown in FIG. 11. This will produce a filtered output RF peak voltage of 1.27 times the B+ voltage.

Significantly, inductor L1 is thus utilized to provide enough current $I_{L1}$ going into the junction point of FETs Q1 and Q2 to assure zero voltage switching at all phase relationships between drive of FETs Q1 and Q3, especially when the drive to FETs Q1 and Q3 are in phase or out of phase. The other side of inductor L1 is connected to a capacitor network of, e.g., two equal valued capacitors C1 and C2 that provide a B+/2 voltage source at their junction point. For example, if B+ is 400 volts, and B− is 0 volts (a relative reference voltage), then the junction point of C1 and C2 would be B+/2 or 200 volts. These capacitors can sink and source the current $I_{L1}$ going through L1. The reactance of capacitors C1 and C2 is small at the frequency of operation. By connecting one capacitor C1 to B+ and one capacitor C2 to B−, the junction point of the two capacitors more quickly converges to B+/2 volts when the RF drive is first turned on.

To provide zero voltage switching for FETs Q3 and Q4, a much smaller inductor than inductor L1 is needed. Inductor L2 is provided for this purpose. The reason for this is explained by way of example in a typical application and with reference to the timing diagrams in the FIGS. 7A–D. When FET Q2 is turned off, the load current $I_{LOAD}$ is about −18 amps. This means that +18 amps would be going into the junction point of FETs Q1 and Q2. A current going into the junction point of FETs Q1 and Q2 will raise the voltage on FET Q2 $V_{DSQ2}$ to B+ when FET Q2 is turned off. When FET Q1 is turned on, the voltage across it $V_{DSQ1}$ will be zero. The same would be true when considering the time when FET Q1 is turned off.

However, this is not the case when FET Q3 or FET Q4 is turned off. In view of the timing charts, the load current $I_{LOAD}$ when FET Q3 is turned off is about −16 amps. This would be pulling +16 amps out of the junction point of FET Q3 and FET Q4. But to change voltage states of the junction point of FETs Q3 and Q4, the current must be going into the junction. For a zero voltage turn on of FET Q4, enough current must be provided to compensate for the load current $I_{LOAD}$ and to provide additional current for changing voltage states of the junction of FETs Q3 and Q4.

For this reason, inductor L2 must provide significantly more current than inductor L1. Considering the timing chart, when FET Q3 is turned off, the current $I_{L2}$ in L2 is about 35 amps. This is enough current to compensate for the 16 amps being pulled out of the junction point of FETs Q3 and Q4 by the load current $I_{LOAD}$, with 19 amps remaining going into the junction point of FETs Q3 and Q4 to raise the voltage at that junction to B+ when FET Q3 is turned off. When FET Q4 is turned on, the voltage across it VDSQ4 will be zero. Therefore, it can be seen that the load current $I_{LOAD}$ at all phase relationships between FETs Q1 and Q3 is in the opposite direction than is needed for zero voltage switching of FETs Q3 and Q4. Thus, to assure zero voltage switching of FETs Q3 and Q4, enough current has to be injected in their junction point (the drain of Q3 and source of Q4) to overcome the load current $I_{LOAD}$ plus enough to assure zero voltage switching. This current IL2 is provided by inductor L2. The other side of inductor L2 is connected to two equal capacitors C3 and C4 which will provide a B+/2 voltage source in the same way as described above for capacitors C1 and C2. Since capacitors C3 and C4 are sinking and sourcing more current than capacitors C1 and C2, their capacitance will be larger.

There are no special requirements for the inductors L1 and L2 used to provide the necessary current. For example, an air core inductor wound on a plastic form with litz wire may be used. The litz wire will help to reduce losses in these parts. However, the proper values of the inductors are important. In an exemplary application, inductor L2 should have, e.g., a reactance of 9 Ω at the frequency of operation. Inductor L1 is less critical and should have, e.g., a reactance of 1000 at the operating frequency. The value of inductor L2 is more critical since it must provide current $I_{L2}$ to compensate for the load current $I_{LOAD}$ and to provide current necessary for zero voltage switching. If inductor L2 has too large of an inductance, there will not be enough current to assure zero voltage switching of FETs Q3 and Q4. The value of inductor L1 is less critical, since it only needs to provide current at the extremes of modulation (maximum negative and positive modulation).

The capacitors C1–C4 may be any low loss capacitor, e.g., polypropylene. Multiple capacitors, e.g., three to four, may be connected in parallel for the capacitor network C3, C4 to give a value of 1.5–2.0 µF. For capacitor network C1, C2, one or two or more capacitors may be connected in parallel to give a value of 0.5–1.0 µF. The actual values of the capacitors are not critical, as long as they are sufficient to handle the respective currents from inductor L1 and inductor L2, and have a small reactance at the operating frequency.

As noted previously, the values stated above are illustrative of an exemplary embodiment. For example, these values are useful with respect to operation within the AM Broadcast Band (0.5 to 1.71 MHz), but suitable values could be used at any desired frequency of operation. Additionally, a voltage of 400 volts was described for the B+ voltage, but a design could utilize a much lower (or a much higher) voltage. The load resistance for the above parameters was based on a 10 Ω value. This also can be changed based on a particular application.

Figure 12:
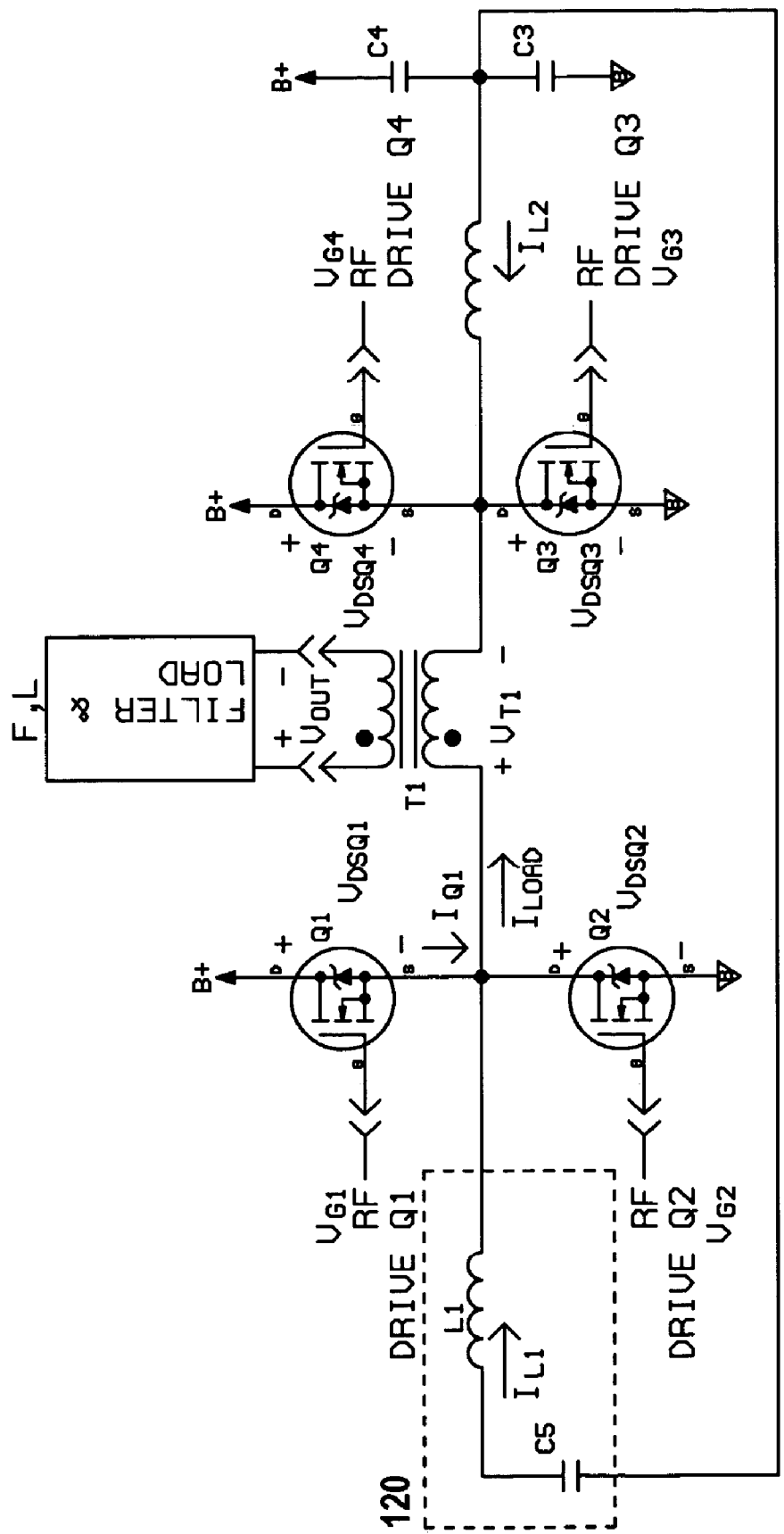
FIG. 12 is a circuit schematic according to an additional embodiment of the invention.

FIG. 12 illustrates an alternative embodiment of the invention similar to that illustrated by FIG. 1A, but with the original coil L1 and capacitors C1, C2 removed. If the modulation does not go to extremes, then switches Q1 and Q2 operate adequately without the coil L1 and the capacitors C1 and C2. Even if the modulation does go to extremes, the coil L1 and the capacitors C1 and C2 are not necessary, although the circuit will operate less efficiently.

For a limited modulation, L1 may be replaced by a coil L1 in series with a capacitor C5 (see block 120) as illustrated in FIG. 12. This improves the efficiency of the design over a small operating area. In the exemplary embodiment shown, coil L1 may be 5.5 uH, coil L2 may be a 0.9 µH coil, capacitors C3 and C4 may be 0.47 µF capacitors, and C5 may be a 0.0012 µF capacitor. These values can easily be adapted to various operating ranges of the circuit.

Additionally, if a different load impedance is utilized (exemplary values described above relate to a 10 Ω load with no reactance), various values of the components, particularly coils L1 and L2 would be utilized.

The H-Bridge circuit according to an embodiment of the invention has been described in terms of an RF amplifier, but nothing precludes the applicability of such a circuit to phase modulated power supplies. This circuit could be used to operate power supplies at a much higher frequency and still maintain high efficiency, although such an application would require that the load be replaced with a rectifier arrangement R, F, L, e.g., a bridge rectifier.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, conventional electronics, control systems, and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. An H-bridge switching circuit for providing power to a load and connected to a supply reference voltage and a relative ground, comprising:

four switches, a first through fourth switch, each comprising a drive input as well as a reference voltage connection and a power supply connection, the four switches being connected in an H-bridge configuration;

an output connected to a secondary winding of a transformer that produces an output signal to the load, a first side of a primary winding of the transformer being connected to the first switch, and a second side of the primary winding of the transformer being connected to the fourth switch;

four RF drives, a first through fourth RF drive, each respectively connected to the first through fourth switch drive inputs, the drives being configured such that the second drive is 180° out of phase of the first drive and includes a period of dead time during which both the first and second drives are off; and adjustment circuitry configured to adjust a phase of the third drive with respect to the first drive so that an overlap time when both the first drive and the third drive are turned on determines an amplitude of the output signal, the adjustment circuitry being further configured to adjust a phase of the fourth drive with respect to the second drive so that an overlap time when both the second drive and the fourth drive are turned on determines the amplitude of the output signal.

2. The circuit according to claim 1, further comprising:

a current source configured to provide current to the four switches to ensure that each switch is turned on when the voltage across it is zero.

3. The circuit according to claim 2, wherein:

the four switches are a first through fourth FET, each comprising a gate, source, and drain, the four field-effect transistors being connected in an H-bridge configuration, wherein:

the source of the first FET is connected to the drain of the second FET, and the drain of the first FET is connected to a supply voltage;

the source of the second FET is connected to the circuit relative ground;

the source of the fourth FET is connected to the drain of the third FET, and the drain of the fourth FET is connected to a supply voltage; and the source of the third FET is connected to a circuit ground;

the first through fourth RF drives are each respectively connected to the first through fourth FET gates;

the transformer is configured to drive the load being connected to a secondary winding of the transformer that produces an output signal, the first side of a primary winding of the transformer being connected to the source of the first FET, and the second side of the primary winding of the transformer being connected to the source of the fourth FET.

4. The circuit according to claim 2, further comprising: a filter connected between the secondary winding of the transformer and the load.

5. The circuit according to claim 2, further comprising: a rectifier connected between the secondary winding of the transformer and the filter and load.

6. The circuit according to claim 5, wherein the rectifier is a diode bridge.

7. The circuit according to claim 2, wherein the current source comprises two inductors, the two inductors comprising:

a first inductor being connected on one side to a middle portion of a first series capacitor network and on an other side to the source of the first FET, the first series capacitor network comprising at least one capacitor connected to the supply voltage, and at least one capacitor connected to the relative ground; and a second inductor being connected on one side to a middle portion of a second series capacitor network and on an other side to the source of the fourth FET, the second series capacitor network comprising at least one capacitor connected to the supply voltage, and at least one capacitor connected to the relative ground.

8. The circuit according to claim 7, wherein:
the capacitors of the first series capacitor network are equivalent in their capacitance value; and
the capacitors of the second series capacitor network are equivalent in their capacitance value.

9. The circuit according to claim 8, wherein the capacitors in the first series capacitor network are lower in capacitance value than the capacitors in the second series capacitor network.

10. The circuit according to claim 7, wherein the first inductor has a larger inductance value than the second inductor.

11. The circuit according to claim 10, wherein the first inductor has a reactance of approximately 100 Ω, and the second inductor has a reactance of approximately 9 Ω.

12. The circuit according to claim 7, wherein one or more of the capacitors is a low-loss capacitor.

13. The circuit according to claim 12, wherein one or more of the capacitors is a polypropylene capacitor.

14. The circuit according to claim 1, further comprising a dead time adjustment mechanism configured to adjust the dead time.

15. The circuit according to claim 14, wherein the dead time is adjusted by the dead time adjustment mechanism to approximately 35 nS.

16. The circuit according to claim 1, wherein the circuit is configured to provide the load with power in a range between 500 W and 9 kW.

17. The circuit according to claim 1, wherein the circuit is configured to provide the load with power in a range between 500 W and 5 kW.

18. The circuit according to claim 2, wherein the current source comprises two inductors, the two inductors comprising:

a first inductor being connected on one side to a first series capacitor and on an other side to the source of the first FET; and a second inductor being connected on one side to a middle portion of a second series capacitor network and on an other side to the source of the fourth FET, the second series capacitor network comprising at least one capacitor connected to the supply voltage, and at least one capacitor connected to the relative ground, the first series capacitor being connected to the middle portion of the second series capacitor network.

* * * * *